(12) United States Patent
Wilm

(10) Patent No.: US 8,079,730 B2
(45) Date of Patent: Dec. 20, 2011

(54) LIGHT SOURCE WITH VARIABLE RADIATION CHARACTERISTIC

(75) Inventor: Alexander Wilm, Singapore (SG)

(73) Assignee: Osram Opto Semiconductors GmbH, Regensburg (DE)

( * ) Notice: Subject to any disclaimer, the term of this patent is extended or adjusted under 35 U.S.C. 154(b) by 193 days.

(21) Appl. No.: 12/236,539

(22) Filed: Sep. 24, 2008

(65) Prior Publication Data

US 2009/0086482 A1    Apr. 2, 2009

(30) Foreign Application Priority Data

Sep. 27, 2007   (DE) .......................... 10 2007 046 339

(51) Int. Cl.
*F21V 21/00*    (2006.01)
(52) U.S. Cl. ........ 362/240; 362/237; 362/247; 362/248; 362/249.05; 362/293
(58) Field of Classification Search .......... 362/84, 362/241–248, 235, 249.02, 612–613, 545, 362/231, 230, 293, 236, 237, 240, 351, 360, 362/311.01, 311.02, 355, 267, 310, 249.05; 313/483, 485, 498–502
See application file for complete search history.

(56) References Cited

U.S. PATENT DOCUMENTS

| | | | |
|---|---|---|---|
| 7,052,152 B2 * | 5/2006 | Harbers et al. .................. 362/30 |
| 7,108,386 B2 * | 9/2006 | Jacobson et al. ................ 362/84 |
| 7,350,933 B2 * | 4/2008 | Ng et al. .......................... 362/84 |
| 2004/0062040 A1 * | 4/2004 | Blume et al. ................... 362/231 |
| 2004/0080938 A1 * | 4/2004 | Holman et al. ................ 362/231 |
| 2004/0179368 A1 * | 9/2004 | Takeda et al. .................. 362/466 |
| 2005/0018436 A1 | 1/2005 | LeLeve |
| 2005/0157508 A1 | 7/2005 | Takeda et al. |
| 2005/0253130 A1 | 11/2005 | Tsutsumi et al. |
| 2006/0022211 A1 | 2/2006 | Yatsuda et al. |
| 2006/0227554 A1 | 10/2006 | Yu |
| 2007/0030675 A1 * | 2/2007 | Oon et al. ....................... 362/237 |
| 2008/0074752 A1 * | 3/2008 | Chaves et al. ................. 359/641 |

FOREIGN PATENT DOCUMENTS

| | | |
|---|---|---|
| DE | 10 2006 046 199 | 4/2008 |
| WO | WO 2004/088200 | 1/2004 |
| WO | WO 2006/012842 | 2/2006 |
| WO | WO 2006/089540 | 8/2006 |
| WO | WO 2008/040283 | 4/2008 |

OTHER PUBLICATIONS

European Search Report issued on Dec. 23, 2008 in corresponding European Application No. 08164438.7 (6 pages).

* cited by examiner

*Primary Examiner* — Thomas Sember
(74) *Attorney, Agent, or Firm* — Fish & Richardson P.C.

(57) ABSTRACT

An array of light-emitting diodes in LED chips, which can be turned on and off individually or in groups by means of a circuit, is provided with a device for homogenizing a light beam emitted by the turned-on LED chips. This device can be a conversion plate, a potting compound comprising a converter material or scattering particles, or a device for beam shaping comprising a plurality of micro-optics. The light source is particularly suited for headlights, for example in AFS applications.

14 Claims, 4 Drawing Sheets

LIGHT SOURCE WITH VARIABLE RADIATION CHARACTERISTIC

CROSS-REFERENCE TO RELATED APPLICATION

Under 35 U.S.C. §119, this application claims the benefit of a foreign priority of German Patent Application 10 2007 046 339.3, filed Sep. 27, 2007, whose disclosure content is hereby incorporated by reference in its entirety.

TECHNICAL FIELD

The present invention is directed to a light source that is constructed as a light-emitting diode and whose radiation characteristic can be varied. This device is particularly suitable for use as an automobile headlight having a dynamic curve light.

BACKGROUND

It is often necessary to vary, during operation, the emission direction of a light source whose light is bundled into a limited solid angle range, as in the case of floodlights, for example. This is of interest particularly in the case of automobile headlights in travel on curves, when the beam direction of the headlight is intended to track the particular direction of travel, as a so-called dynamic curve light. Such headlight systems have become known in particular from the Citroen DS series. Dating back much farther, however, there were rotary headlight mountings which were mechanically connected to the steering, causing the headlights to swivel along with the front wheels as the vehicle was steered.

With the advent of the use of light-emitting diodes (LEDs) in headlights, there was a resurgence of interest in dynamic curve light, now known as AFS (advanced front-lighting systems). AFSs are intended not only to provide better illumination of the road in the particular direction of travel on a curve, but also to adapt the particular light distribution to different environmental conditions.

SUMMARY

An AFS can be built without moving parts, using an array of fixedly installed LEDs. The LEDs are turned on and off individually or in groups. However, one problem that can occur with this type of design is that in the case of direct projection from the LEDs, the pattern of the individual light sources and the intervening dark spaces may be visible, so uniform illumination is not achieved. This is objectionable particularly in headlight applications.

The present disclosure specifies a light source having a variable radiation characteristic, which is suitable in particular for AFSs and by means of which largely uniform illumination can be achieved with the least possible technical expenditure.

The light source includes an array of LEDs in the form of mounted LED chips and a circuit by means of which the LEDs are turned on and off individually or in groups. A device for homogenizing the emitted light beam is present, and is operative to bring about largely uniform and/or spatially continuously varying illumination of an illuminated object, for example the road. In the preferred embodiments, this device includes as an essential component a conversion plate, a potting compound or an array of micro-optics. A combination of two or three of these components is also possible.

DESCRIPTION OF DRAWINGS

The invention will be described more precisely below with reference to the appended figures.

Figure 1:
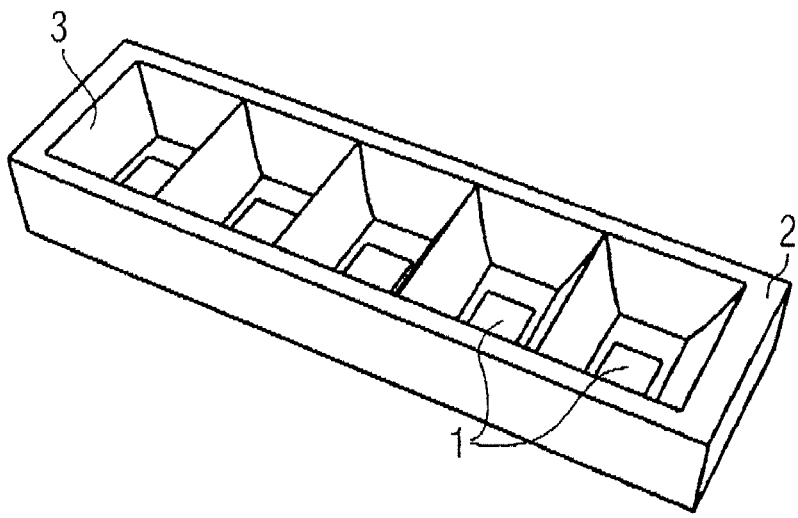
FIG. 1 shows an exemplary embodiment of an array of LED chips in a housing.

Like, similar or like-acting elements are provided with the same respective reference numerals in the figures. The figures and the size relationships of the elements depicted in the figures are not to be considered true to scale with respect to one another. Rather, individual elements may be depicted as exaggeratedly large for the sake of better illustration and/or better understanding.

DETAILED DESCRIPTION

In one exemplary embodiment of the light source, an array of LED chips into which light-emitting diodes are integrated is provided with a plate, hereinafter referred to as a conversion plate, which is arranged in the direction of emission of the emitted light beam and brings about homogenization of the light beam. The conversion plate can, for example, be a plate made of glass or transparent plastic, which is furnished with a coating of a material that brings about the intended homogenization of the light beam. The beam shaping can also be effected by means of a material that is mixed into the material of the plate. Depending on the intended application of the light source, it may be sufficient to mix into the coating or into the glass or plastic of the plate small particles that cause the light passing therethrough to be scattered, and thus lead to a more uniform distribution of light emission. Instead of or in addition to this, the coating or the plate can contain a converter material by means of which the wavelength and/or the bandwidth of the spectrum of the emitted light is varied.

It is essential, in this regard, that the emission of light does not take place through a completely light-transparent cover, but through a conversion plate, which brings about the intended more uniform distribution of light emission in the above-described manner. It is thereby also possible, in particular, for the light emission to become continuously weaker from the center of the beam to the sides. Such a tapered distribution of light emission can be advantageous particularly in headlight applications.

Figure 10:
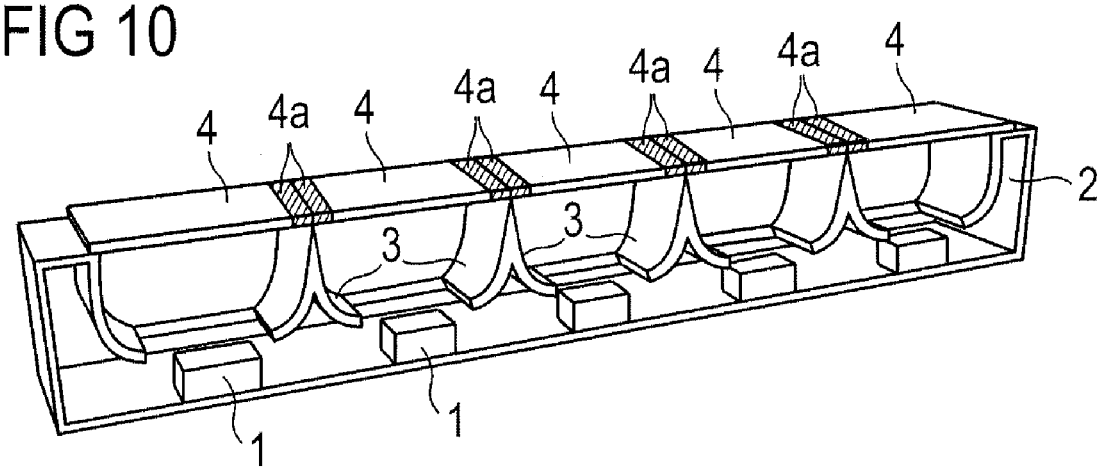
FIG. 10 shows a cross-section through a housing and a conversion plate.

As shown in FIG. 10, a subplate 4 of the conversion plate can be provided for each LED chip used in the array. The edges of these subplates 4 can be provided with coatings 4a that are at least largely opaque to the light that is to be emitted. In this way, the emitted light is not scattered within the conversion plate and the light emanating from a particular LED chip is emitted only in the region of the associated subplate. A light-opaque edge coating can also be limited to an outer edge of the conversion plate. The array of LED chips is particularly suitably mounted in a housing that has individual compartments each accommodating one LED.

FIG. 1 is an oblique plan view of an array of LED chips 1 in compartments of a housing 2 that is preferably light-opaque and is open in the intended direction of emission of the light. Partitions between the compartments can be formed, as represented in FIG. 1, by collimating devices 3 by means of which the light emitted by a respective LED chip is bundled. In the exemplary embodiment illustrated in FIG. 1, said collimating devices 3 are reflective surfaces that are curved in such a way that the emitted light is bundled. For this purpose, the reflective surfaces can have an at least approximately parabolic cross section. The array is depicted in FIG. 1 as open at the top.

Figure 2:
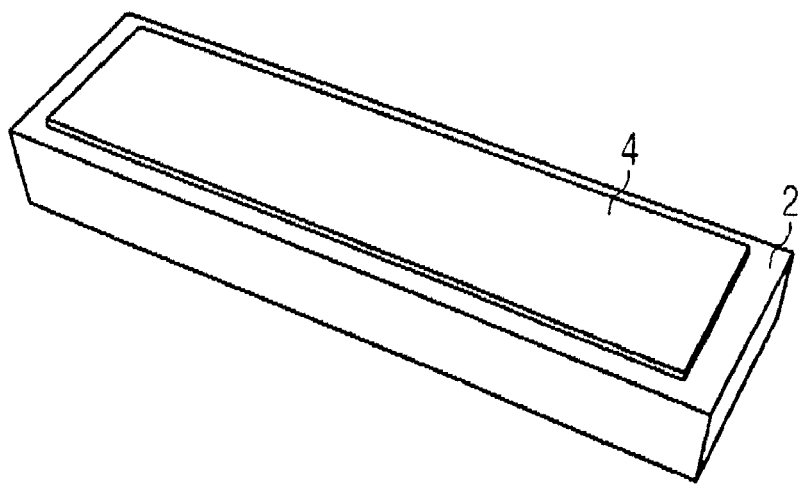
FIG. 2 shows the housing according to FIG. 1, topped by a conversion plate.

FIG. 2 shows the housing 2 according to FIG. 1 topped by a conversion plate 4. The compartments of the housing and the LED chips inside them are not discernible in FIG. 2, indicating that the conversion plate 4 is not completely clear and light-transparent; however, this is not to be construed as meaning that the conversion plate 4 is opaque to light. The intended homogenization of the emitted light beam is a result of the optical properties of the conversion plate 4. Since the entire top side of the housing is provided with the conversion plate 4, the emitted light beam is homogenized effectively regardless of which of the LED chips are turned on. Spatially uniform or continuously varied emission of light is thereby always obtained in a simple manner under different operating conditions.

Figure 3:
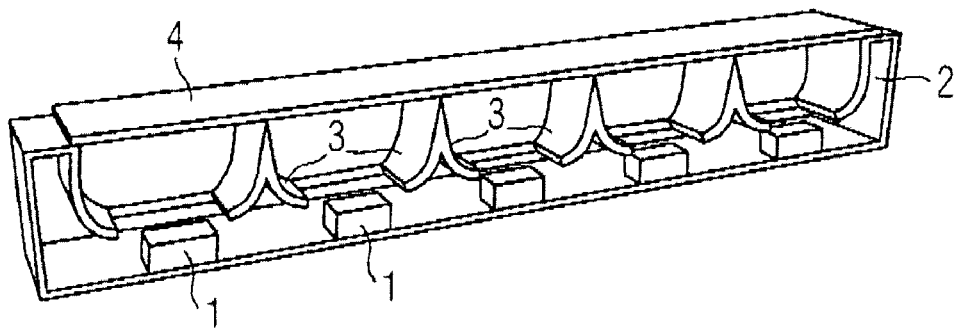
FIG. 3 shows a cross section through the housing according to FIG. 2, viewed from another direction.

FIG. 3 shows a cross section through the array of FIG. 2, viewed from a lateral direction. The parabolically curved collimating devices 3 are clearly visible here above their respective LED chips 1. On the top side of the housing 2, the conversion plate 4 is depicted for the sake of clarity as a single continuous plate. As noted above, however, the conversion plate can also be composed of subplates, each of which is associated with one LED chip and covers approximately that region of the housing opening through which the light from the particular LED is emitted (see FIG. 10). Depending on the degree of transparency to light, the conversion plate produces the intended radiation characteristic of a uniformly luminous surface, whose light emission can be projected in a desired manner via another optical device. The light distribution is varied by turning the LED chips on and off. The array of LEDs can be suitably selected according to the intended application and the housing can have correspondingly diverse shapes; in particular, it can be curved.

Figure 4:
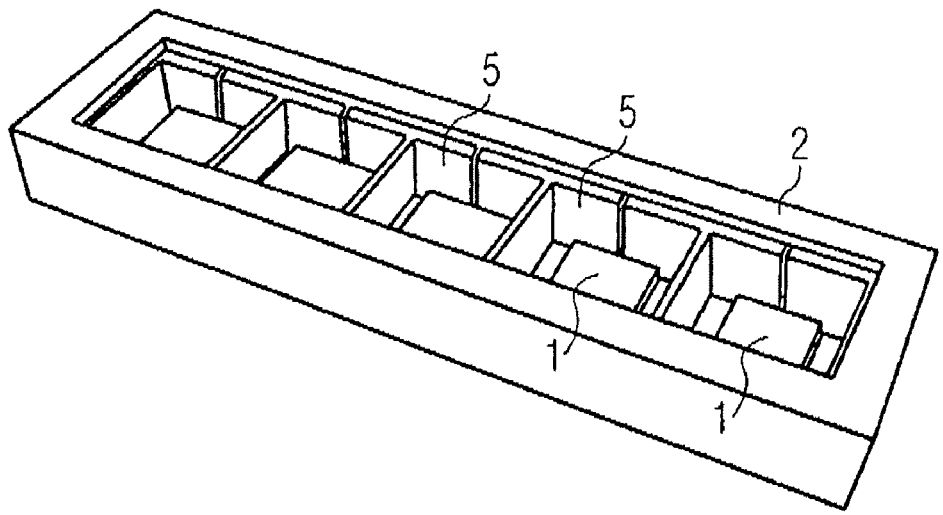
FIG. 4 shows another exemplary embodiment of an array of LED chips in a housing.

FIG. 4 shows another exemplary embodiment of an array of LED chips 1 in a housing 2, which is preferably opaque to light and is open in the intended direction of emission of light. Between the LED chips are partitions 5, which for example can be made of glass and can have a typical thickness of at least 25 μm and no more than 75 μm, for instance 50 μm. The partitions can be opaque to the emitted light and can preferably be diffusely reflective. Provided inside the housing 2 is a potting compound 7, which is provided with a converter material or with scattering particles. The potting compound 7 thus is not completely clear and light-transparent, but brings about homogenization of the emitted light beam. A converter material in the potting compound also serves to vary in accordance with the intended application of the light source the wavelength or bandwidth of the spectrum of the light generated by the LEDs. It may also be sufficient instead to diffuse the light by means of small scattering particles distributed in the potting compound. Here again, in this exemplary embodiment the distribution of the light emission can be varied merely by turning the LEDs in the LED chips on and off. Light-opaque partitions 5 prevent the light from propagating transversely to the emission direction and on into the potting compound. The intended variation of the light emission is thereby effectively achieved by turning the LED chips on and off, and the radiation characteristic is not compromised by any propagation of light within the housing.

Figure 5:
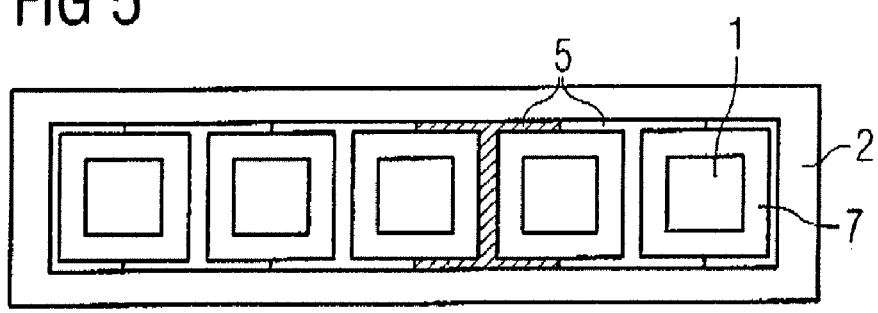
FIG. 5 shows a plan view of the array according to FIG. 4.

FIG. 5 shows the array according to FIG. 4 in a plan view, in which the LED chips 1 are depicted by way of example with a square light emission surface, and the constituent elements of the partitions 5 are readily discernible. The partitions are formed here by individual elements that are H-shaped in plan; they may also, however, be formed of one piece, be connected to the housing 2, or be an integral component of the housing 2.

Figure 6:
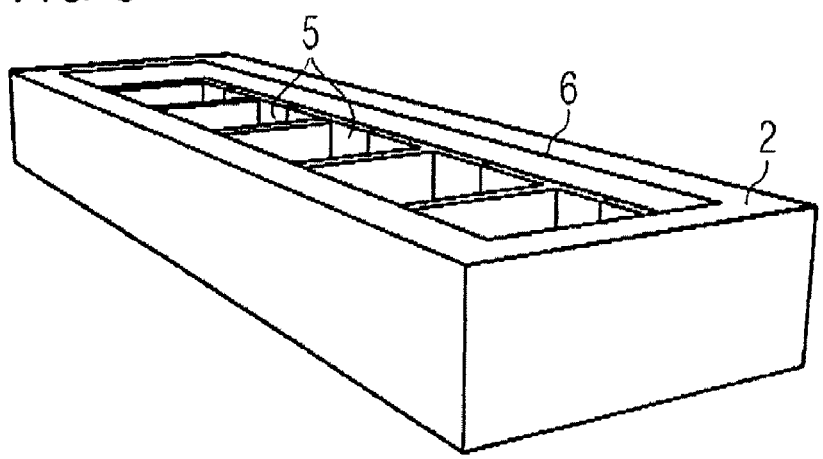
FIG. 6 shows the housing according to FIG. 4 viewed from another direction.

In FIG. 6, which is an oblique plan view of the array according to FIG. 4, it is clearly apparent from another angle of view that it may be advantageous, in this exemplary embodiment, for the housing edges 6 to be slightly higher than the upper edges of the partitions 5. In this case, the potting compound 7 can even be present inside the housing 2 above the partitions 5 and cover the tops of the partitions. This results in sufficient homogenization of the emitted light beam even in the vicinity of the partitions. The relative dimensions that must be given to the inner volume of the housing and to the partitions in order to achieve this can be selected according to the particular embodiment and the desired degree of homogenization of the light beam. In this exemplary embodiment, as well, the arrangement of the LEDs can be selected according to the particular intended application, and the housing can have correspondingly diverse shapes; in particular, it can be curved.

Figure 7:
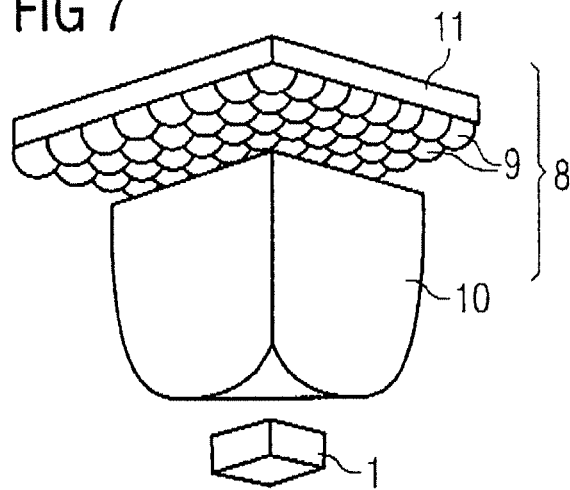
FIG. 7 shows an array of an LED chip and a device for beam shaping.
Figure 8:
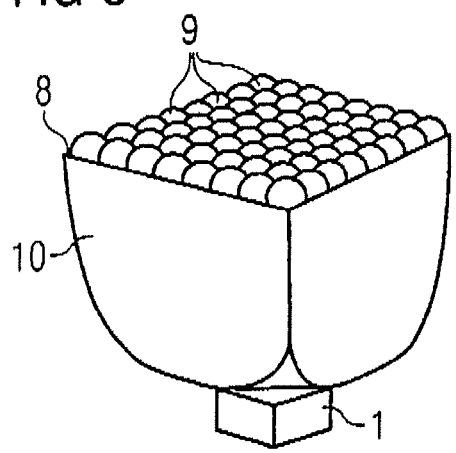
FIG. 8 shows an array according to FIG. 7 for another exemplary embodiment.
Figure 9:
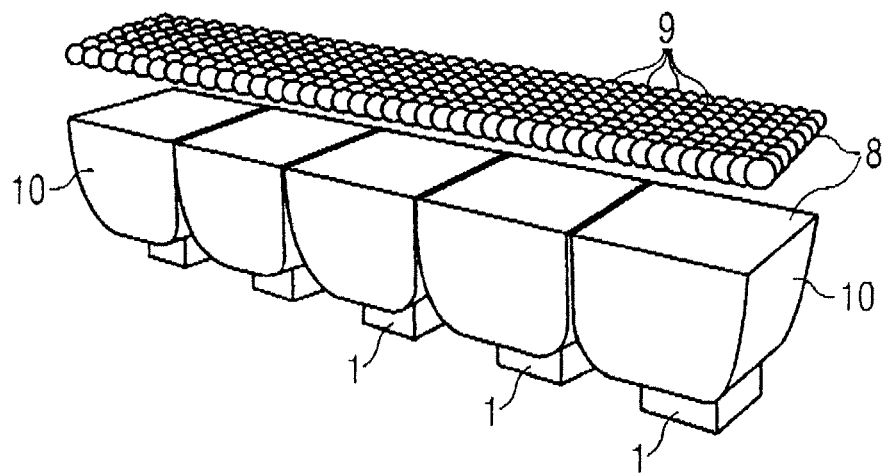
FIG. 9 shows an array composed of a plurality of arrays according to FIG. 7.

A further exemplary embodiment is illustrated in FIGS. 7 to 9. Here, in the arrangement illustrated in FIG. 7, associated with a particular LED chip 1 is a device 8 for beam shaping, which in the exemplary embodiment shown includes, as its primary optic, a plate 11 provided with micro-optics 9 and a collimating optical device 10. The essential element here is the array of micro-optics 9, which can be small lenses, for example. The micro-optics 9 serve to effect beam-shaping according to the desired light distribution. This makes it possible to obtain any desired radiation characteristic in a solid angle that is greater than the solid angle of the beam precollimated by collimating optical device 10.

Whereas in the exemplary embodiment according to FIG. 7 the micro-optics 9 are arranged on a light-transparent plate 11, the micro-optics can also be integrated right into a collimating optical device 10, as is the case in FIG. 8. It can be seen in FIGS. 7 and 8 that the collimating optical device 10, which is used here as the primary optic for beam bundling, can have curved reflective side surfaces, which for example have a substantially parabolic cross section. They can also each be a parabolic reflector having a round output surface. In that case, the reflective surfaces are formed by a paraboloid of rotation, in the manner known per se from headlight applications.

A plurality of arrays according to FIG. 7 or 8 can be combined into a common array of plural LED chips, for example according to FIG. 9, such that here again, the light distribution can be varied as intended simply by turning the LED chips on and off individually or in groups. The emitted light beam is homogenized in each case by the device 8 for beam shaping, such that in this exemplary embodiment, as well, the radiation characteristic can be varied without the use of mechanical components, while at the same time sufficient homogenization of the emitted light beams can be achieved in every operating condition of the array.

The exemplarily illustrated components of the various exemplary embodiments can also be combined with one another. In particular, the array according to FIG. 9 can be disposed in a housing according to the exemplary embodiments of FIG. 1 or 4. The collimating optical devices 10 can then, for example, be formed by the collimating devices 3 in the housing type of FIG. 1. In another such exemplary embodiment, the conversion plate 4 is replaced by the array of micro-optics 9 depicted in FIG. 9.

A secondary optic can be provided for projecting the homogenized light beam. The secondary optic can comprise, for example, a projection lens and/or a reflector system. In applications of the exemplary embodiments according to FIGS. 1 and 6, the use of such a secondary optic is normally advantageous or even necessary, whereas in the exemplary embodiments according to FIGS. 7 to 9, there is no need for additional optical devices. Sufficiently good projection of the light beam onto the object to be illuminated is ensured merely by the configuration of the micro-optics 9.

The invention is not limited to the exemplary embodiments by the description of it with reference thereto. Rather, the invention encompasses any novel feature and any combination of features, including in particular any combination of features recited in the claims, even if that feature or combination itself is not explicitly mentioned in the claims or exemplary embodiments.

What is claimed is:

1. A light source comprising:
   an array of LED chips;
   a circuit by means of which the LED chips can be turned on and off individually or in groups; and
   a device for homogenizing a light beam emitted by a turned-on LED chip, the device including a conversion plate which changes wavelengths and bandwidths of the light beam
   wherein the conversion plate is subdivided into subplates having edges, each subplate is associated with a respective LED chip, and the edges of the subplates are provided with light-opaque coatings.

2. The light source as in claim 1, comprising:
   a housing that comprises compartments and is open on a side provided for light emission;
   wherein the LED chips are disposed in the compartments of the housing;
   wherein the compartments of the housing are provided with collimating devices by means of which the light emitted by each LED chip is bundled; and
   wherein the side of the housing provided for light emission is provided with the conversion plate.

3. The light source as in claim 1, wherein the conversion plate is a transparent plate provided with a coating made from a converter material.

4. The light source as in claim 1, wherein the conversion plate is formed of a material comprising a converter material.

5. The light source as in claim 1, wherein the conversion plate comprises a light-transparent material in which scattering particles are distributed.

6. The light source as in claim 1, comprising:
   a housing that comprises compartments and is open on a side provided for light emission,
   wherein the LED chips are disposed in the compartments of the housing,
   wherein the compartments of the housing are provided with partitions that are opaque to or at least not completely transparent to the emitted light, and
   wherein the housing is filled with the potting compound.

7. The light source as in claim 6, comprising:
   a housing edge that projects above the partition on that side of the housing which is provided for light emission;
   wherein the potting compound is present within the housing even above the partitions and covers the partitions.

8. The light source as in claim 1, comprising:
   a housing that comprises compartments and is open on a side provided for light emission wherein
   the LED chips are disposed in the compartments of the housing,
   the compartments of the housing are provided with partitions, and
   the partitions are glass.

9. The light source as in claim 1, comprising:
   a housing that comprises compartments and is open on a side provided for light emission, wherein
   the LED chips are disposed in the compartments of the housing,
   the compartments of the housing are provided with partitions, and
   the partitions are opaque to the emitted light.

10. The light source as in claim 1, comprising:
    a housing that comprises compartments and is open on a side provided for light emission, wherein
    the LED chips are disposed in the compartments of the housing,
    the compartments of the housing are provided with partitions, and
    the partitions are diffusely reflective of the emitted light.

11. The light source as in claim 10, wherein the micro-optics are lenses.

12. The light source as in claim 1, wherein the device for beam shaping includes collimating optical devices that are disposed between one of the LED chips and a fraction of the micro-optics.

13. The light source of claim 1, wherein the circuit is operable to vary the distribution of light emitted by the light source by turning the LED chips on and off individually or in groups.

14. The light source of claim 1, wherein the circuit is operable to vary the distribution of light emitted by the light source by turning the LED chips on and off individually or in at least two groups.

* * * * *